United States Patent [19]

Margozzi

[11] Patent Number: 4,757,255
[45] Date of Patent: Jul. 12, 1988

[54] ENVIRONMENTAL BOX FOR AUTOMATED WAFER PROBING

[75] Inventor: Paul D. Margozzi, San Jose, Calif.

[73] Assignee: National Semiconductor Corporation, Santa Clara, Calif.

[21] Appl. No.: 835,137

[22] Filed: Mar. 3, 1986

[51] Int. Cl.$^4$ .................... G01R 35/00; G01R 31/02
[52] U.S. Cl. ............................ 324/158 F; 324/73 PC
[58] Field of Search ............ 324/158 F, 158 P, 73 PC, 324/72.5, 158 D; 174/35 R, 35 C, 35 MS; 361/394, 395, 399

[56] References Cited

U.S. PATENT DOCUMENTS

| | | | |
|---|---|---|---|
| 3,408,565 | 10/1968 | Frick et al. | 324/158 F X |
| 3,412,333 | 11/1968 | Frick et al. | 324/158 F |
| 3,557,777 | 1/1971 | Cohen | 174/35 MS |
| 3,590,372 | 6/1971 | Di Santis et al. | 324/158 D |
| 3,656,058 | 4/1972 | Leathers | 324/158 F |
| 3,710,251 | 1/1973 | Hagge et al. | 324/158 F |
| 4,607,220 | 8/1986 | Hollman | 324/158 F |

Primary Examiner—Ernest F. Karlsen
Assistant Examiner—Vinh P. Nguyen
Attorney, Agent, or Firm—Gail W. Woodward

[57] ABSTRACT

An automatic wafer probing system is disclosed as being located inside an environmental box filled with a positive pressure dry inert gas. The wafer to be probed is mounted on a Thermochuck that has a high thermal contact with the wafer. The chuck can be precisely heated or cooled over the temperature range of −60° C. to +200° C. An atmosphere of dry $N_2$ gas allows sub 0° C. wafer probing without condensation on the wafer. The box is constructed of metal so as to shield any electromagnetic interferance that could possibly disrupt the testing procedure. A probe card produces probe contact with the chip circuits on the wafer and data taken at desired temperatures. The box includes a window that is in registry with the probe contacts and an externally mounted microscope looks through the window at the probe region. The wafer and window are rendered moisture free by dry $N_2$ gas. The wafer probing action and the probe testing is under the control of a desktop computer.

4 Claims, 3 Drawing Sheets

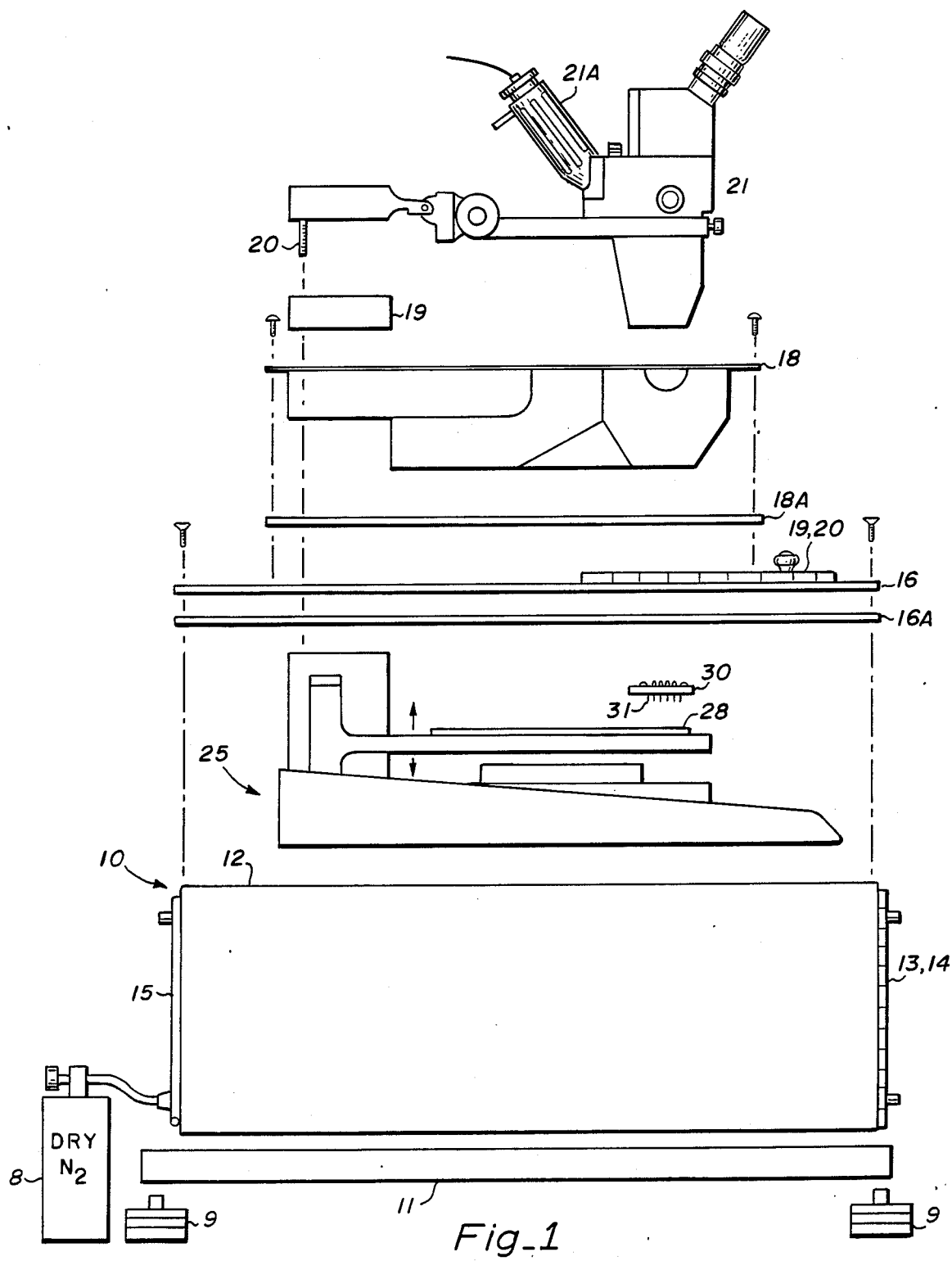
Fig_1

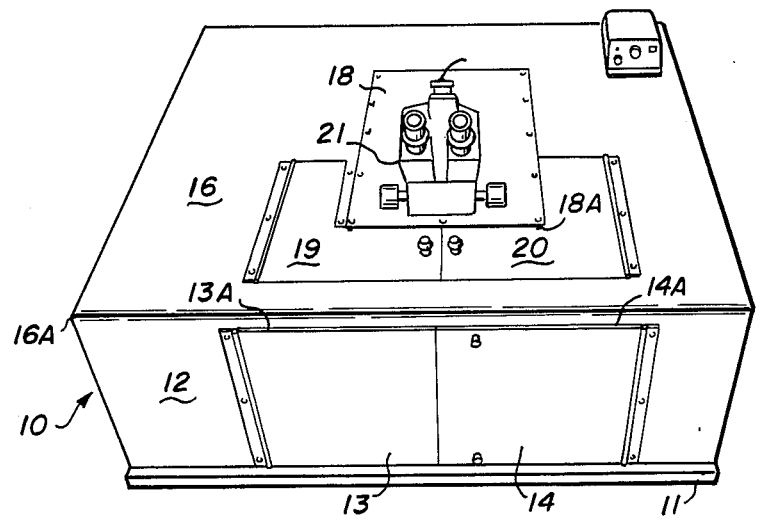
Fig_2
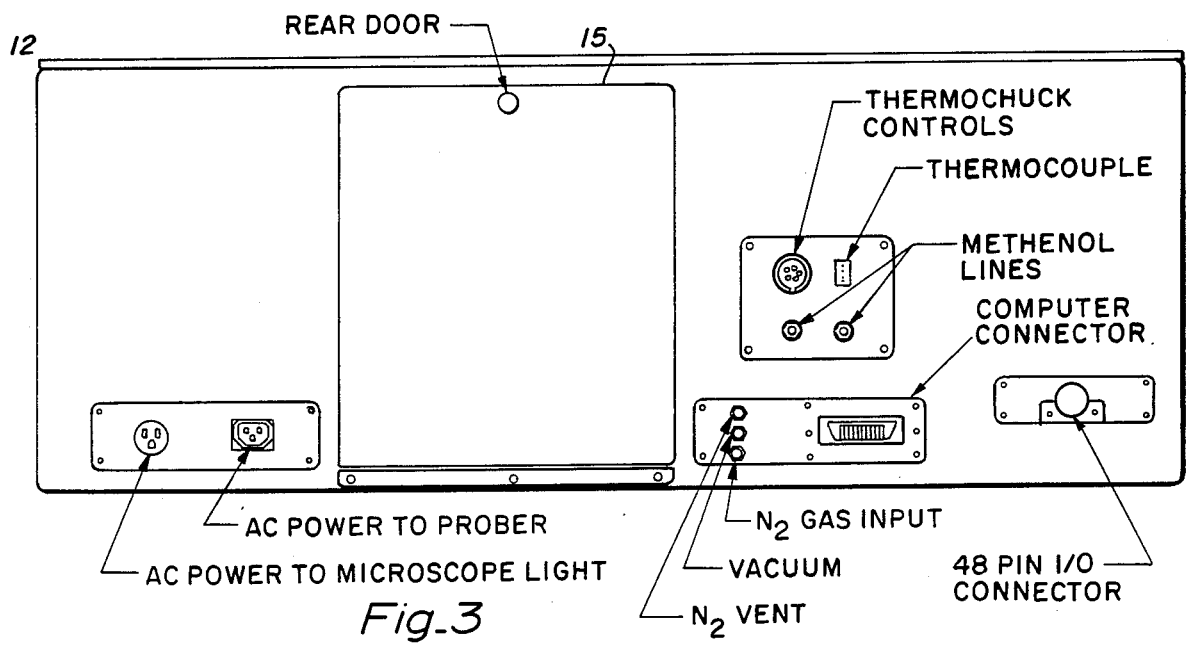
Fig_3
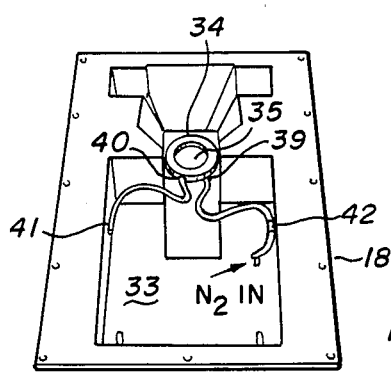
Fig_4

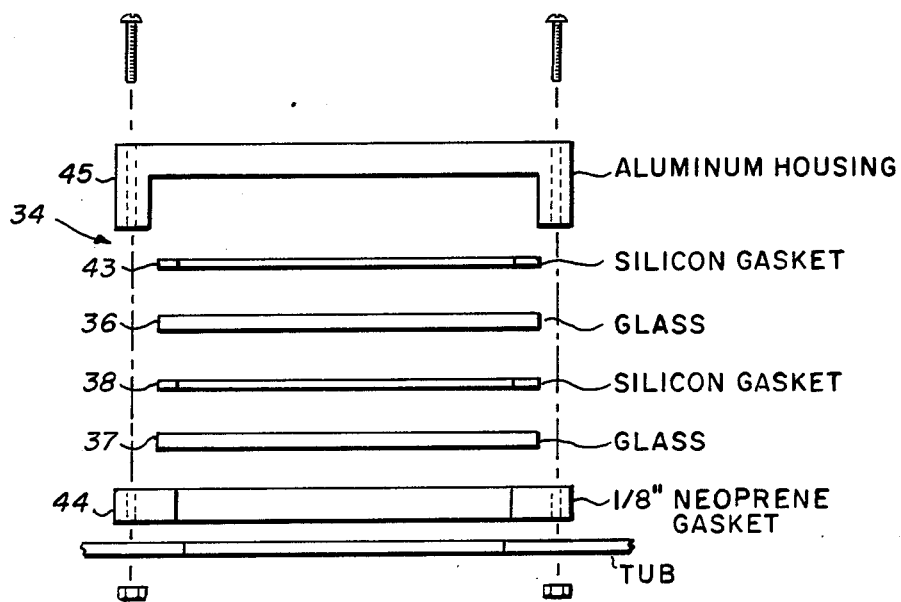
Fig_5

ENVIRONMENTAL BOX FOR AUTOMATED WAFER PROBING

BACKGROUND OF THE INVENTION

The invention relates to the testing of semiconductor devices, particularly at sub 0° C. temperatures, in wafer form. Typically, semiconductor devices are tested over a broad temperature range. Such environmental testing is commonly done on assembled devices, but this is undesirable because the wafers must be processed into finished assembled components before such testing can be accomplished. Such delays in obtaining data on material are objectionable. Testing assembled devices is also slo becuse it takes time to stabilize the packaged IC chip temperature to obtain temperature extreme data. It is much more desirable to temperature cycle an entire wafer and to probe the circuits thereon in the usual manner. However, a number of troublesome problems must be overcome. At the lower temperature moisture can collect on the wafer and on the viewing optics. This moisture is undesirable in that it can interfere with electrical testing and obscure viewing of the wafer. It is further desirable to electrically shield the test station to avoid electro magnetic interference with the test operation.

One solution that has been used is to blow dry nitrogen gas over the wafer in the test fixture. This prevents moisture condensation, but makes it difficult to regulate wafer temperture. Alternatively, it has been proposed to evacuate the test station environment, but this requires an expensive housing and the application of a vacuum cycle slows down the system operation.

SUMMARY OF THE INVENTION

It is an object of the invention to provide an environmental box which can contain a suitable atmosphere in which to probe semiconductor wafers over temperature particularly below 0° C.

It is a further object of the invention to provide shielding against electromagnetic interferance while permitting automated wafer probing over temperature.

It is still a further object of the invention to provide an environmental box that has a window that permits external optics for viewing the probing operation over temperature.

These and other objects are achieved in the following manner. A metal box is mounted upon a vibration isolated base table and is provided with a positive pressure dry nitrogen amtmosphere. The box contains a wafer probe station and a vacuum holding chuck that can be temperature cycled over the desired test range. Typically, a liquid refrigerant, methenol, will be used to lower the wafer temperature to as low as −60° C. The chuck can be used to raise the wafer temperature to +200° C. max The vacuum chuck is mounted upon an X-Y axis indexable table that can bring any of the circuits on the wafer into alignment with the probes on a conventional probe card or up to six manual manipulators. The probe card (or manipulator array) is mounted upon a frame that provides movement along the Z axis. The probe card is raised above the wafer, the X-Y axis indexable table is then manr pulated to index the desired wafer portion into position. Then, the probes are lowered into contact with the wafer and the electrical measurements taken as desired. A viewing microscope is located exterior to the box and is mounted to look through a suitable window. The window is composed of a pair of spaced apart glass panes with the space between filled with dry nitrogen. The window is located over the probe card so that the probes can be observed using a conventional microscope. Alternatively, the microscope view can be displayed by a TV-type monitor. The microscope viewer is employed to orient the wafer and to index a probe position. Then, the system can be employed to automatically step the probes across the wafer to sequentially index the other circuits in the well known manner.

BRIEF DESCRIPTION OF THE DRAWING

FIG. 1 is an exploded view of the environmental box showing the various components.

FIG. 2 shows the assembled environmental box.

FIG. 3 is a rear view of the box.

FIG. 4 is a top view of the microscope tub and viewing window frame.

FIG. 5 is an exploded cross-section view of the viewing window of FIG. 4.

DESCRIPTION OF THE INVENTION

Referring now to FIG. 1, which is an exploded assembly drawing, FIG. 2, which shows the environmental box assembled, and FIG. 3 which is a rear view of the box, the basic features will be described. Box 10 is made of metal and is designed to rest upon a massive one-inch thick bottom plate 11 that rests on air pots 9. This construction acts as a mechanical vibration damper that isolates the box from its mechanical environment. Frame 12 includes front access doors 13 and 14 which are shown in their closed position. Rear access door 15 provides access to the rear of the box. A positive inert atmosphere is maintained inside box 10 by coupling a source of dry nitrogen 8 to a fitting on the rear of the box.

Top plate 16 is fastened to frame 12 via gasket 16A and contains a cutout section into which a microscope tub 18 is fastened. Tub 18 is sealed by means of gasket 18A. Doors 19 and 20 are located over a plexiglas window (not shown) that is mounted to the underside of plate 16. Thus, when doors 19 and/or 20 are opened the operator can see inside box 10, but the internal atmosphere is maintained. Accordingly, doors 19 and 20 are not access doors. As will be detailed hereinafter, tub 18 incorporates a window sealed thereto which will permit viewing inside the box. A microscope 21 and light source 21A is mounted on tub 18 so that the optics will look inside box 10. If desired, microscope 21 can incorporate a TV camera (not shown) which shares the optics and can transmit a TV image to a remote display.

Box 10 is sealed in assembly by means of a neoprene gasketing shown at 16A and 18A. Also, doors 13–15 close against resilient gaskets that provide seals shown at 13A and 14A. Typically, the gasketing is arranged so that a small leak is present and a low rate of $N_2$ flow into the box from a dry $N_2$ source 8 will maintain an inert low moisture environment inside box 10. Alternatively, an exterior low flow rate vent can be provided.

Prober 25 is located inside box 10 and establishes a probe card 30 contact region 31 where the probes touch the wafer The prober contains the elements to drive the vacuum chuck 27 in the X-Y axes with respect to probe card frame 28. Frame 28, which includes means to accommodate a conventional probe card 30, can also be moved vertically as shown by the arrows with respect to vacuum chuck 27. X-Y-Z axis adjustment of the vacuum chuck is accomplish either by computer or by directional buttons on the prober. Microscope 21 is mounted over spacer 19 by means of bolts 20 that extend through slots in tub 18 and fasten to the frame of prober 25.

Vacuum chuck 27 is preferred to be a Thermochuck which is a registered trademark of Temptronics, Incorporated, a supplier located at 55 Chapel Street, Newton, MA 02158, U.S.A. The top surface of Thermochuck 27 is flat and contains aperatures which are coupled to a source of vacuum (not shown). The silicon wafer being probed is held firmly against the suface of the Thermochuck. chuck. This surface is gold plated for high thermal conduction. A closed system of flowing methanol refrigerant is used to cool the wafers as low as −60° C. The Thermochuck system can hold such temperatures to +1° C. and the silicon wafer surface temperature variation is less than 0.5% over the entire area of the wafer. When high temperature testing is desired, an electrical heater inside the Thermochuck can operate it as high as 200° C.

FIG. 4 shows the details of tub 18 which is designed to contain a viewing window and the optical elements needed to observe the wafer probing operation. A recessed portion at 33 provides the mounting surface for microscope 21 which has an objective lens located above viewing window assembly 34. The window area 35 is located over a hole in tub 18 which is directly over the probe area 31 of probe card 30 on holder 28. By using this form of window the microscope is completely exterior to the box 10 and its optics are not subjected to any harsh environmental conditions. The spacing between the microscope objective lens and the surface of the wafer being viewed is determined by the mounting and is established in accordance with the microscope requirements.

Window 34 is shown in an exploded sectional view in FIG. 5. Two flat glass pieces 36 and 37 are separated by a spacer ring 38. This ring is segmented and composed of silicon. The space between the glass plates will be filled with dry nitrogen by way of entry port 39 and exit port 40. This nitrogen can be flowing, if desired, or it can be simply held in the space by means of flow controls 41 and 42. The entry and exit ports are established adjacent to gaps in spacer 38 which are created by the above-mentioned segments.

Silicon spacer ring 43 and neoprene spacer ring 44 are located above plate 36 and below plate 37 respectively. The window assembly is secured to tub 18 by way of a collar 45 which is bolted in place to compress the elements shown in the window assembly.

EXAMPLE

An environmental box, 36-inches wide and 30-inches deep, of the kind described above, was constructed under the project name AESOP (Automated Environmental Station for Over temperature Probing). The system is capable of forcing wafer temperatures ranging from −60° C. to +200° C. The metal construction provided shielding against environmental electromagnetic waves. The construction also isolated the probe station from floor vibrations and the viewing optics were isolated from harsh temperatures.

The box was used in conjunction with an Automated Device Analysis System (ADAS) which employs a Hewlett-Packard (HP) 9836CS desktop computer as the main controller. This computer controls an HP4145A semiconductor parameter analyzer, HP4280A capacitance meter, HP2932A printer, HP7550A graphics plotter and HP7809 16.5M hard disk memory. A Rukers and Koll 681A automatic prober was employed for wafer contacting. The entire test system is under the control of the desktop computer.

It was found that a 50° C. change in true wafer temperature could be accomplished in about two minutes after the Thermochuck reached desired temperature. The testing could be accomplished at the lowest temperatures without any condensation of moisture on the wafer or fogging of the viewing window. Testing is accomplished in accordance with standard wafer parameter evaluation on a step and repeat basis automatically.

The invention has been described and an operating example detailed. When a person skilled in the art reads the foregoing description, alternatives and equivalents, within the spirit and intent of the invention, will be apparent. Accordingly, it is intended that the scope of the invention be limited only by the following claims.

I claim:

1. An environmental box apparatus for the automated probing of semiconductor wafers, said box comprising:
    a metal box having an interior enclosing a volume of controlled atmosphere, said metal box including metal access doors that can be opening to gain access to said interior of said box and gasketing means associated with said doors for rendering said box substantially air-tight when said doors are closed;
    a probe station located within said interior of said box and having a probe contact region associated therewith, said probe station being electrically shielded by said metal box;
    means for holding a semiconductor wafer in relation to said probe contact region whereby said wafer can be probe contacted;
    means for indexing said wafer holding means with respect to said probe contact region whereby individual circuits on said wafer can be selectively contacted; and
    window means associated with said box located in alignment with said probe contact region whereby said probe contact can be viewed by optical means exterior to said box.

2. The environmental box of claim 1 further comprising means for filling said boxy with a dry inert gas atomosphere.

3. The environmental box of claim 1 wherein said window means comprises two sheets of glass separated by a space containing a dry gas atmosphere.

4. The environmental box of claim 1 wherein said holding means comprise a vacuum chuck which includes means for controllably heating and cooling said wafers.

* * * * *